US012592357B2

(12) United States Patent
Jiang et al.

(10) Patent No.: US 12,592,357 B2
(45) Date of Patent: Mar. 31, 2026

(54) SYSTEM AND METHOD FOR MULTI-BEAM ELECTRON MICROSCOPY USING A DETECTOR ARRAY

(71) Applicant: KLA Corporation, Milpitas, CA (US)

(72) Inventors: Xinrong Jiang, Palo Alto, CA (US); Youfei Jiang, Milpitas, CA (US); Amir Azordegan, Santa Clara, CA (US)

(73) Assignee: KLA Corporation, Milpitas, CA (US)

( * ) Notice: Subject to any disclaimer, the term of this patent is extended or adjusted under 35 U.S.C. 154(b) by 594 days.

(21) Appl. No.: 18/078,828

(22) Filed: Dec. 9, 2022

(65) Prior Publication Data

US 2024/0194440 A1 Jun. 13, 2024

(51) Int. Cl.
*H01J 37/244* (2006.01)
*H01J 37/28* (2006.01)

(52) U.S. Cl.
CPC ........... *H01J 37/244* (2013.01); *H01J 37/28* (2013.01); *H01J 2237/2443* (2013.01); *H01J 2237/24475* (2013.01); *H01J 2237/2448* (2013.01)

(58) Field of Classification Search
CPC .. H01J 37/05; H01J 37/09; H01J 37/12; H01J 37/244; H01J 2237/0475; H01J 2237/04924; H01J 2237/057; H01J 2237/24485; H01J 2237/12; H01J 2237/2801; H01J 37/21; H01J 37/28
See application file for complete search history.

(56) References Cited

U.S. PATENT DOCUMENTS

| | | | | |
|---|---|---|---|---|
| 6,465,783 B1 * | 10/2002 | Nakasuji | ................. | H01J 37/28 |
| | | | | 250/311 |
| 6,734,428 B2 * | 5/2004 | Parker | ..................... | H01J 37/28 |
| | | | | 850/9 |
| 6,750,455 B2 * | 6/2004 | Lo | ......................... | B82Y 40/00 |
| | | | | 250/346 |
| 6,844,550 B1 * | 1/2005 | Yin | ......................... | G21K 5/10 |
| | | | | 850/9 |
| 7,285,779 B2 * | 10/2007 | Litman | .................. | H01J 37/28 |
| | | | | 250/306 |

(Continued)

FOREIGN PATENT DOCUMENTS

WO          2016154484 A1      9/2016

OTHER PUBLICATIONS

Korean Intellectual Property Office, International Search Report and Written Opinion received in International Application No. PCT/US2023/082235, Mar. 28, 2024, 10 pages.

*Primary Examiner* — David A Vanore
(74) *Attorney, Agent, or Firm* — Suiter Swantz IP

(57) ABSTRACT

A system and method of an electron multi-beam imaging system is disclosed. The system may include an imaging sub-system. The imaging sub-system may include one or more electron beam sources configured to generate a plurality of beamlets to simultaneously probe a plurality of measurement regions on a sample. The imaging sub-system may further include one or more electron optics configured to adjust the plurality of beamlets. The imaging sub-system may further include a detector array, where the detector array includes a plurality of detectors configured to detect electrons emanating from a measurement region of the sample. For the system and method, each detector may include a pass-through channel configured for receiving a beamlet of the plurality of beamlets.

22 Claims, 14 Drawing Sheets

(56) References Cited

U.S. PATENT DOCUMENTS

| | | | | |
|---|---|---|---|---|
| 8,362,425 | B2 * | 1/2013 | Han | H01J 37/04 |
| | | | | 250/306 |
| 9,922,796 | B1 * | 3/2018 | Frosien | H01J 37/153 |
| 10,896,800 | B2 * | 1/2021 | Riedesel | H01J 37/09 |
| 11,239,053 | B2 * | 2/2022 | Zeidler | H01J 37/3177 |
| 11,335,608 | B2 * | 5/2022 | Jiang | H01J 37/14 |
| 2013/0320220 | A1 * | 12/2013 | Donowsky | B32B 15/08 |
| | | | | 250/366 |
| 2014/0361167 | A1 * | 12/2014 | Morishita | H01J 37/28 |
| | | | | 250/310 |
| 2015/0155134 | A1 * | 6/2015 | Frosien | H01J 37/1474 |
| | | | | 250/310 |
| 2016/0336142 | A1 * | 11/2016 | Liu | H01J 37/28 |
| 2017/0090051 | A1 * | 3/2017 | Zhao | G01T 7/005 |
| 2018/0068825 | A1 * | 3/2018 | Brodie | G01N 23/2251 |
| 2018/0136344 | A1 * | 5/2018 | Nelson | G01T 1/20181 |
| 2018/0254167 | A1 * | 9/2018 | Zhao | H01J 37/20 |
| 2019/0164721 | A1 * | 5/2019 | Shaked | H01J 37/244 |
| 2019/0355545 | A1 * | 11/2019 | Zeidler | H01J 37/21 |
| 2020/0027687 | A1 * | 1/2020 | Cook | H01J 37/244 |
| 2020/0152412 | A1 * | 5/2020 | Ren | H01J 37/1474 |
| 2020/0321191 | A1 * | 10/2020 | Ren | H01J 37/145 |
| 2021/0210309 | A1 * | 7/2021 | Wieland | H01J 37/09 |
| 2022/0196581 | A1 * | 6/2022 | Wieland | G01N 23/2251 |
| 2023/0207253 | A1 * | 6/2023 | Wieland | H01J 37/302 |
| | | | | 250/307 |
| 2023/0298850 | A1 * | 9/2023 | Scotuzzi | H01J 37/28 |
| | | | | 250/307 |
| 2024/0079204 | A1 * | 3/2024 | Wang | H01J 37/244 |
| 2024/0079205 | A1 * | 3/2024 | Wieland | H01J 37/12 |
| 2024/0096587 | A1 * | 3/2024 | Zeidler | H01J 37/28 |
| 2024/0128051 | A1 * | 4/2024 | Zeidler | H01J 37/244 |
| 2024/0145208 | A1 * | 5/2024 | Slot | H01J 37/28 |
| 2024/0194440 | A1 * | 6/2024 | Jiang | H01J 37/244 |
| 2025/0104966 | A1 * | 3/2025 | Schubert | H01J 37/21 |

* cited by examiner

1

SYSTEM AND METHOD FOR MULTI-BEAM ELECTRON MICROSCOPY USING A DETECTOR ARRAY

TECHNICAL FIELD

The present disclosure relates generally to electron beam devices and, more particularly, to electron beam devices with multiple beams for high-throughput sampling and a retractable detector array.

BACKGROUND

Semiconductor devices such as 3D NAND flash, 3D DRAM, and 3D Logic include deeper features such as memory holes, channel holes, staircase steps, and deep trenches. For example, some 96-layer 3D NAND flash devices include hundreds of billions of memory holes at depths of tens of microns from an upper surface.

As reliability constraints become stricter, inspecting and reviewing these features at high throughput for defects becomes increasingly desirable. However, deeper features are especially challenging to inspect and review at high throughput using a multi-beam approach. Generally, an electron beamlet containing primary electrons directed to a sample generates secondary electrons (SEs) and backscattered electrons (BSEs). Using SEs for high throughput imaging of deeper features may be impractical due to an inability of SEs to escape from the bottom of features such as memory holes. Using BSEs also presents challenges. For at least some BSE detection methodologies, using higher densities of beamlets (e.g., dozens, hundreds) is impractical due to signal crosstalk between the BSEs of densely-spaced beamlets degrading the images. Generally, crosstalk between neighboring beamlets arises if the detectable electrons associated with neighboring beamlets overlap, creating "ghost" features in images. Crosstalk may reduce the clarity, resolution, and/or throughput of an imaging system. As the number and density of beamlets increases, crosstalk may be impractical to overcome using other methodologies.

Therefore, it would be advantageous to provide a system that overcomes the challenges described above.

SUMMARY

An electron multi-beam imaging system is disclosed, in accordance with one or more embodiments of the present disclosure. The electron multi-beam imaging system may include an imaging sub-system. In one illustrative embodiment, the imaging sub-system may include one or more electron beam sources configured to generate a plurality of beamlets to simultaneously probe a plurality of measurement regions on a sample. In another illustrative embodiment, the imaging sub-system may further include one or more electron optics configured to adjust the plurality of beamlets. In another illustrative embodiment, the imaging sub-system may further include a detector array, where the detector array includes a plurality of detectors configured to detect electrons emanating from a measurement region of the sample. In another illustrative embodiment, each detector may include a pass-through channel configured for receiving a beamlet of the plurality of beamlets.

In another illustrative embodiment, the detector array may be actuatable between a first position and a second position.

A method is disclosed, in accordance with one or more embodiments of the present disclosure. In one illustrative embodiment, the method may include generating electrons of a plurality of beamlets using one or more electron beam sources. In another illustrative embodiment, the method may include adjusting the plurality of beamlets using one or more electron optics configured to receive the plurality of beamlets. In another illustrative embodiment, the method may include receiving each beamlet of the plurality of beamlets through a pass-through channel of a respective detector of a detector array. In another illustrative embodiment, the method may include illuminating, for each beamlet, a measurement region of a sample. In another illustrative embodiment, the method may include collecting, for each beamlet, electrons emanating from the measurement region using the respective detector. In another illustrative embodiment, the method may include detecting the electrons using the respective detector.

In another illustrative embodiment, the method may include actuating the detector array from a second position to a first position.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

One method for detecting SEs and BSEs using a single beam is disclosed in U.S. patent application Ser. No. 17/224,407, filed Apr. 7, 2021, which is hereby incorporated by reference in its entirety. However, single beams may not allow for the throughout desired for imaging billions of features.

Embodiments of the present disclosure are directed to an electron multi-beam imaging system including a detector array allowing for high throughput by simultaneously probing multiple measurement regions on a sample. For example, each detector of the detector array may receive a beamlet through a pass-through channel and be positioned for detecting electrons associated with the beamlet. In this regard, crosstalk between detected electrons of different beamlets may be reduced compared to other methods. Additional embodiments of the present disclosure are directed to the electron multi-beam imaging system including two imaging modes by virtue of the detector array being retractable. For example, the detector array may be positioned near the sample for imaging BSEs and in a retracted position when operating in an alternate imaging mode that utilizes a secondary detector.

Figure 1:
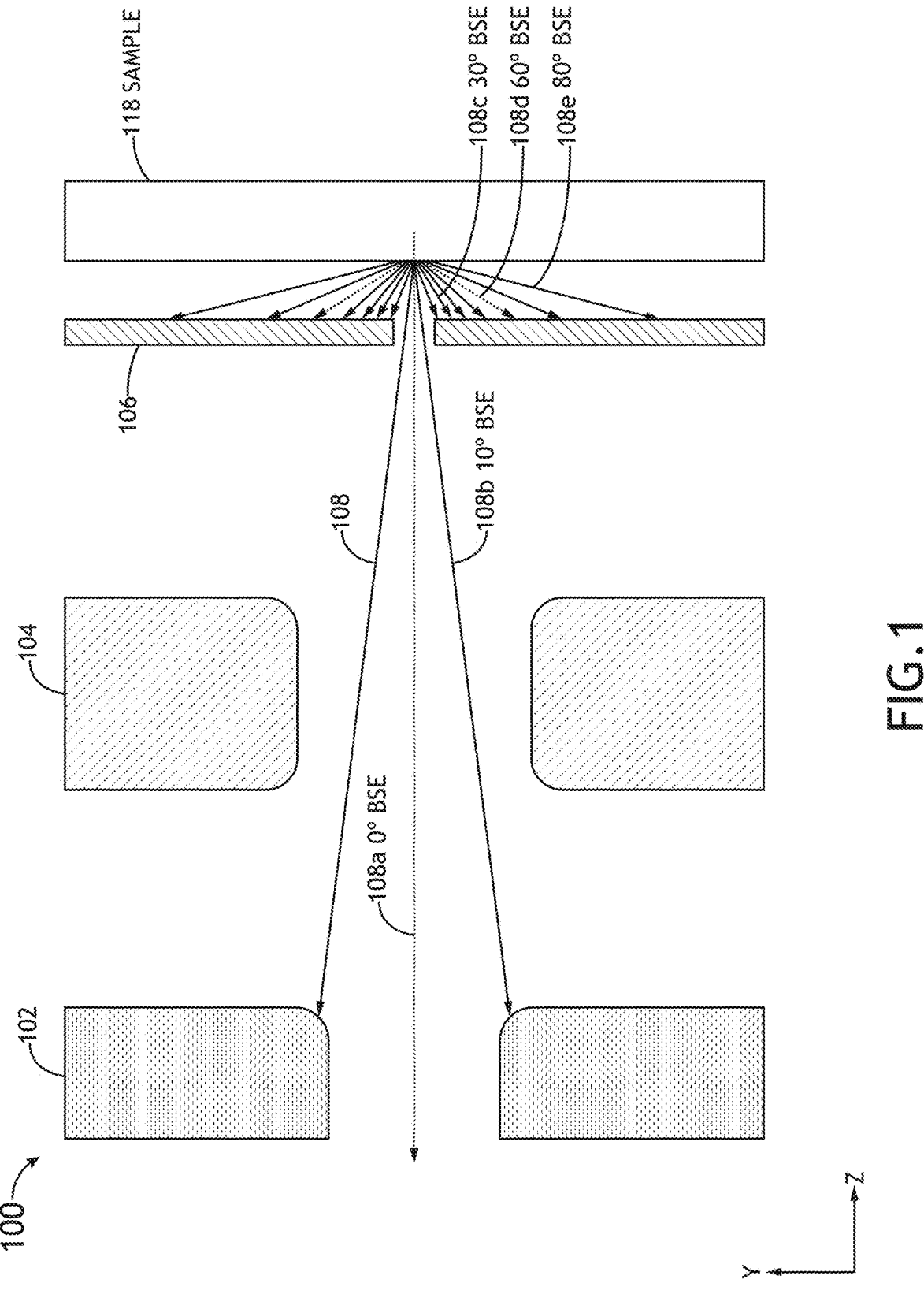
FIG. 1 is a simplified schematic view of an electron beam imaging system with backscattered electrons emanating from a sample.

FIG. 1 illustrates a simplified schematic view of an electron beam imaging system with BSEs 108 emanating from a sample 118. Depending on the angle of emanation from the sample 118, the BSEs 108 may not necessarily be able to reach a detector (not shown) to the left of FIG. 1. For example, 10° BSEs 108*b*, 30° BSEs 108*c*, 60° BSEs 108*d*, and 80° BSEs 108*e* all are blocked by various elements such as a ground electrode 102, a booster electrode 104, and a charge control plate 106. Any remaining portion of BSEs 108 that do make it past such elements, such as 0° BSEs 108*a*, are not likely to be sufficient to generate a quality signal for image forming purposes.

Figure 2:
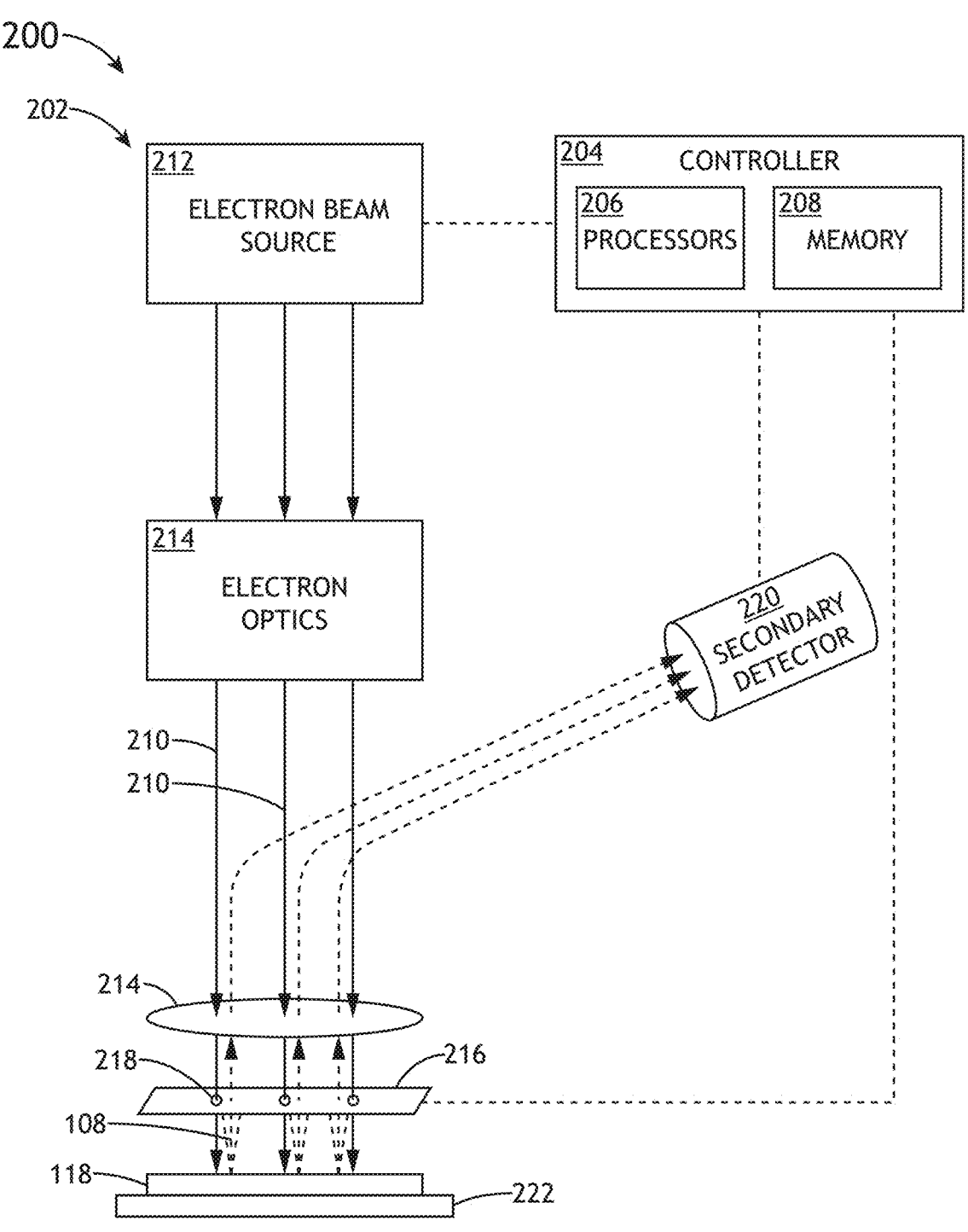
FIG. 2 is a simplified block diagram view of an electron multi-beam imaging system, in accordance with one or more embodiments of the present disclosure.

FIG. 2 illustrates a simplified block diagram view of an electron multi-beam imaging system 200, in accordance with one or more embodiments of the present disclosure. In embodiments, the electron multi-beam imaging system 200 may be configured for inspection (e.g., mask or wafer inspection) or imaging-based metrology.

In embodiments, the electron multi-beam imaging system 200 includes an imaging sub-system 202 and a controller 204. The controller 204 may include one or more processors 206 configured to execute program instructions maintained on memory 208.

In embodiments, imaging sub-system 202 includes one or more electron beam sources 212 configured to generate a set of beamlets 210 to simultaneously probe a set of measurement regions on a sample 118. For example, the imaging sub-system 202 may include a single electron beam source 212 and an aperture/lens array configured to split a single electron beam into the set of beamlets.

In embodiments, imaging sub-system 202 includes electron optics 214 configured to adjust the beamlets 210. The electron optics 214 may include relatively small elements for adjusting each beamlet 210 individually and/or global elements for adjusting all of the beamlets 210 simultaneously. For example, the electron optics 214 may include an array of elements, where each element is configured to receive and adjust a beamlet 210. The element may adjust the beamlet 210 via any method known in the art. Methods include, but are not limited to, adjusting a focus, acceleration, uniformity, aperture size or any other quality of the beamlet 210 such as via electrostatic fields, magnetic fields, apertures, and/or the like. In this regard, for example, an array of stigmators may be used for correcting an astigmatism of each beamlet 210. By way of another example, a single global element may be configured to make adjustments to all of the beamlets 210 simultaneously, such as via relatively larger electrostatic and/or magnetic fields.

In embodiments, the imaging sub-system 202 includes a sample stage 222 configured to move and/or rotate the sample 118.

In embodiments, the imaging sub-system 202 includes a detector array 216. The detector array 216 may overcome the challenges of other methodologies and provide for reduced crosstalk. Various embodiments utilizing the detector array 216 are described herein. In embodiments, the detector array 216 includes a set of pass-through channels 218. The set of pass-through channels 218 allows individual incident beamlets 210 to pass through the detector array 216. The use of individual beamlet pass-through channels 218 allows for closer placement of the detector array 216 to the sample 118 without obstructing the incident beamlets 210. Since the BSEs 108 scatter outwards from the sample 118 in all directions, placing the detector array 216 closer to the sample 118 stops the BSEs 108 from scattering radially outwards too far. Reducing the radial scatter distance of the BSEs 108 reduces the crosstalk (i.e., overlap) of the BSEs 108, improving the signal and allowing for a higher density of beamlets 210. A higher density of beamlets 210 allows for using a higher number of beamlets 210 and a higher throughput for imaging billions of features. In this regard, the pass-through channels 218 allow for an improved electron multi-beam imaging system.

Figure 3:
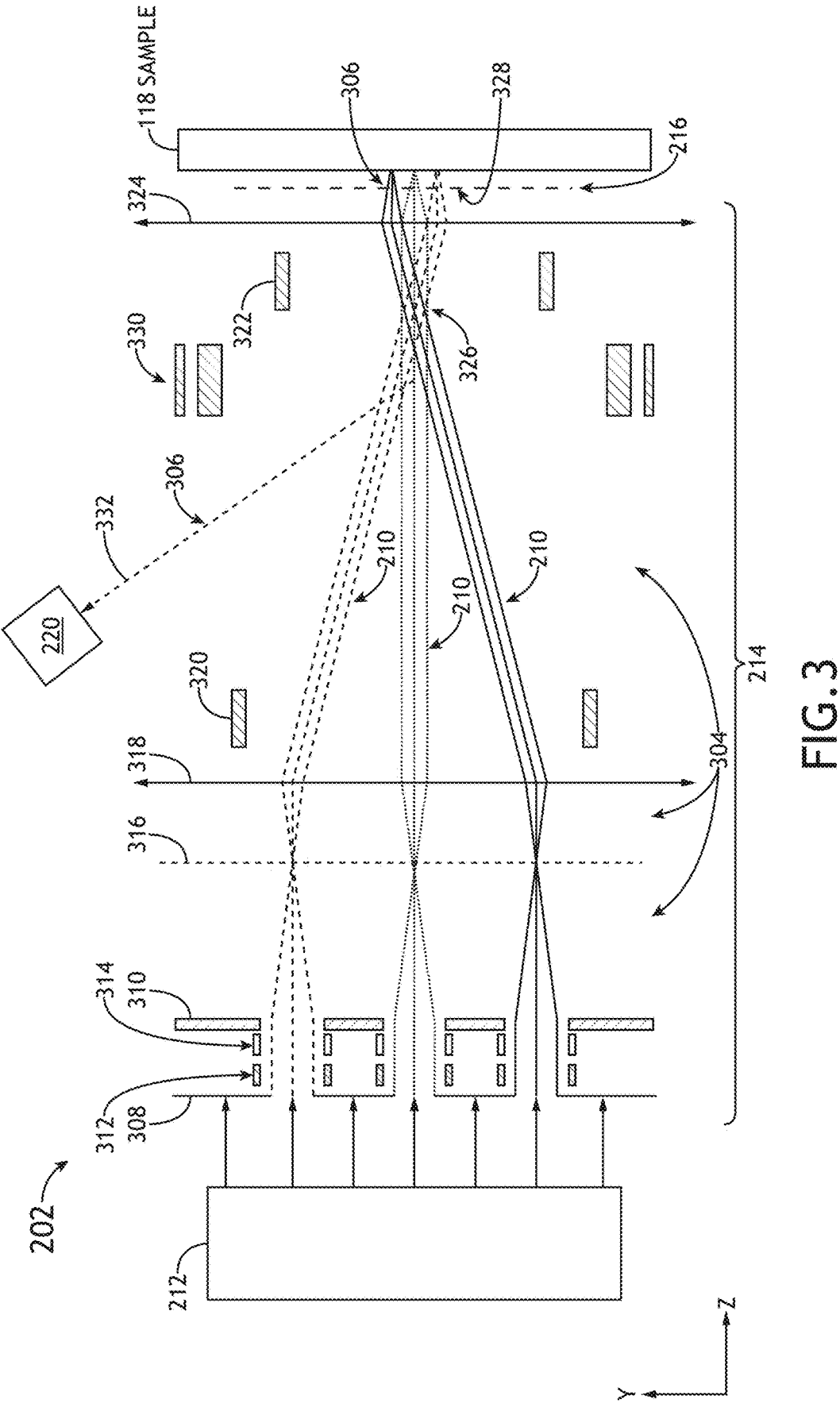
FIG. 3 is a simplified schematic view of an imaging sub-system, in accordance with one or more embodiments of the present disclosure.

FIG. 3 illustrates a simplified schematic view of an imaging sub-system 202, in accordance with one or more embodiments of the present disclosure.

In embodiments, the imaging sub-system 202 includes an illumination pathway 304 and a collection pathway 306. The illumination pathway 304 is defined as including a path that electrons (e.g., beamlets 210 and the like) travel from generation at a source (e.g., electron beam source 212) until reaching the sample 118 and any components associated with such a pathway such as modulators. Modulators generally include, but are not limited to, apertures, deflectors, lenses, filters, accelerators, and the like. The collection pathway 306 is defined as including a path that electrons (e.g., SEs, BSEs, and the like) emanating from the sample 118 take on their journey to a detector and any components associated with such a pathway such as the detector array 216, the secondary detector 220, and modulators (e.g., Wien filters, apertures, attractors, and the like).

In embodiments, the imaging sub-system 202 includes a secondary detector 220. For example, the secondary detector 220 may, in a sense, be an alternate detector. For instance, when the detector array 216 is in the first position as shown, electrons 332 may be, but are not necessarily, obstructed from reaching the secondary detector 220. However, when the detector array 216 is in the second position (not shown), electrons 332 may be unobstructed from reaching the secondary detector 220. In this regard, actuating the detector array 216 to and from the first/detecting position may allow for switching between an imaging mode that uses the detector array 216 and an alternate imaging mode that uses the secondary detector 220. For example, imaging sub-system 202 may be configured to detect BSEs using the detector array 216 when in a first/detecting position and configured to detect SEs with the secondary detector 220 when the detector array 216 is in the second/retracted position. In this regard, for example, the detector array 216 may be used to detect BSEs of features such as memory holes in the first imaging mode and the imaging sub-system 202 may still detect SEs in the alternate imaging mode. However, note that using the secondary detector 220 in an alternate imaging mode is merely an example. In some configurations the secondary detector 220 may work in tandem with the detector array 220 for detection purposes-such as may occur in some scintillator configurations.

In embodiments, the detector array 216 is configured to be disposed between the electron optics 214 and the sample 118. For example, the secondary detector 220 may be positioned farther from the sample 118 than the detector array 216. In this regard, the detector array 216 may be closer to the sample 118, which may reduce crosstalk/overlap of BSEs of different beamlets 210.

In embodiments, the imaging sub-system 202 includes a Wien filter 330 configured to separate/deflect electrons 332 (e.g., SEs) from the primary electrons of beamlets 210. In this regard, electrons 332 are detectable by the secondary detector 220.

In embodiments, a focus depth range (i.e., the distance/depth of material that appears in focus when imaging the sample 118) of the imaging sub-system 202 is at least 10 μm (e.g., at least 20 μm). For example, the focus depth range may be at least 20 μm for imaging memory holes having aspect ratios (AR) of 1:200 of width to depth.

In embodiments, the imaging sub-system 202 includes an objective lens 324 configured to focus the beamlets 210 to telecentrically form on (or in) the sample 118. For example, the objective lens may be used to set the depth of focus of the beamlets 210 to be deeper than or nearer to the surface of the sample 118.

In embodiments, the imaging sub-system 202 includes an aperture array electrode 308, a micro lens array 310, a micro deflector array 312, a micro stigmator array 314, a transfer lens 318, an upper scanner deflector 320, and/or a lower scanner deflector 322. Such electron optics 214 may be used to adjust the beamlets 210.

The intermediate image plane 316 and the sample 118 are the object plane and image plane of the electron optics 216, respectively. Common crossover volume 326 is where beamlets 210 intersect.

Figure 4:
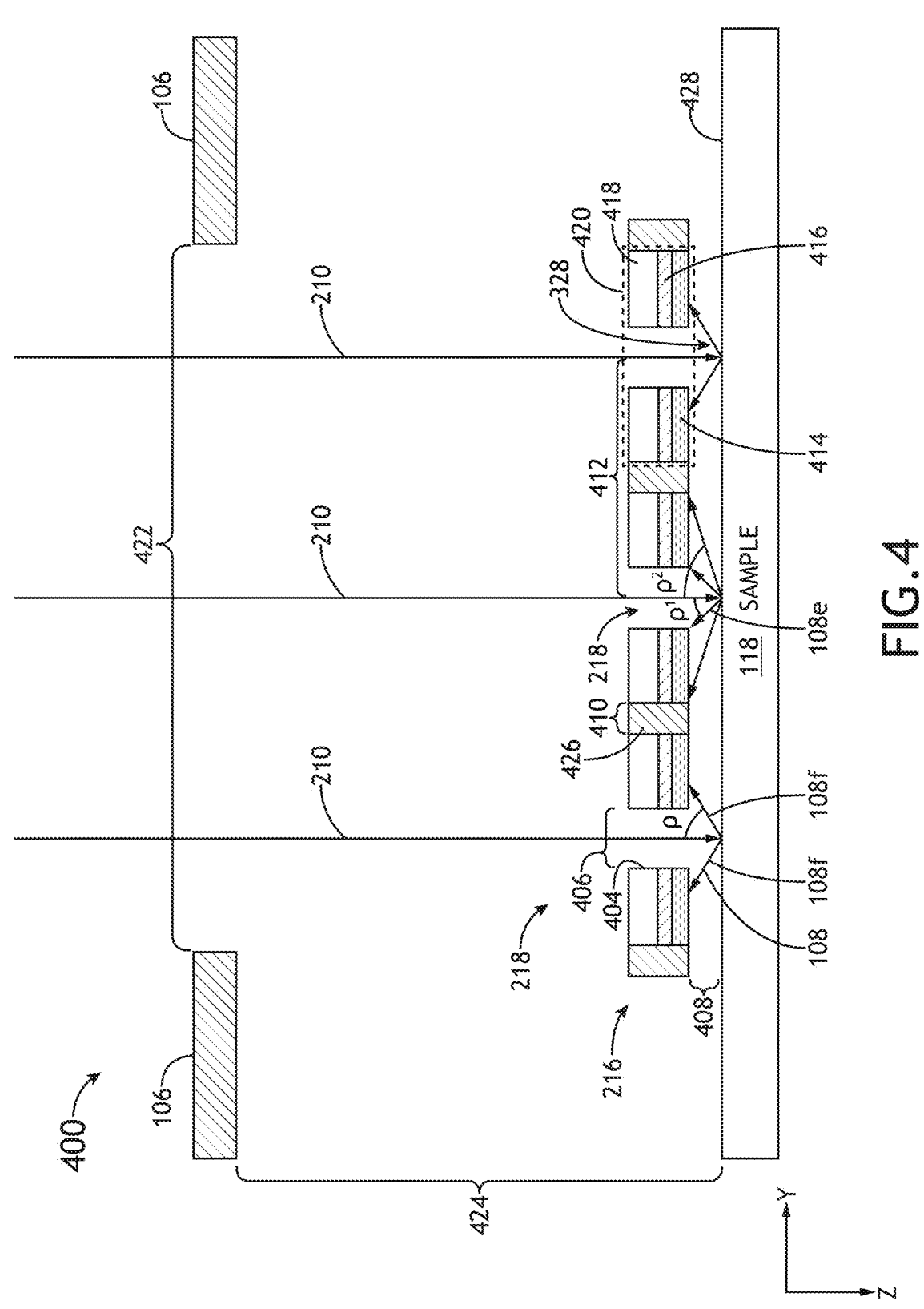
FIG. 4 is a simplified schematic view of a detector array, in accordance with one or more embodiments of the present disclosure.

FIG. 4 illustrates a simplified schematic view 400 of a detector array 216, in accordance with one or more embodiments of the present disclosure.

In embodiments, the detector array 216 includes a set of detectors 420. For example, each detector 420 may be associated with a respective beamlet 210.

In embodiments, each detector 420 includes a pass-through channel 218 configured for receiving a beamlet 210. The pass-through channel 218 may be defined by an inner surface 404 of the detector 420. In this regard, each detector 420 may be aligned with, and allow a beamlet 210 to pass through, the detector 420 on a path to the sample 118. In embodiments, each detector 420 may be configured to detect electrons 108 emanating from a measurement region 328 of the sample 118 associated with a beamlet 210. For example, a first detector may be configured to detect BSEs 108f emanating from a first measurement region. Further, a second detector 420 may be configured to detect BSEs 108e emanating from a second measurement region.

For example, being configured to detect BSEs may include the arrangement, size, structure, and detecting/material qualities of the detectors 420. For instance, being located closer to the measurement region 328 that a particular beamlet 210 is directed to may allow for a particular detector 420 to collect the electrons 108 associated with that particular beamlet 210.

Further, being relatively close to the sample 118 may provide for reduced crosstalk by reducing the amount of distance divergent BSEs 108 have to spread out and overlap each other. For instance, a sample separation distance 408 of the detectors 420 may define the distance between the sample 118 and the detectors 420. In embodiments, a desired amount of sample separation distance 408 may depend on many factors such as the required image quality needed, pitch between beamlets 210, emanation path angles (ρ) and energies of BSEs 108, and the like. For example, the sample separation distance 408 may be less than 500 μm, less than 100 μm, less than 50 μm, less than 20 μm, less than 5 μm, and/or the like. In this regard, crosstalk may be reduced.

In embodiments, the detector array 216 is configured for detecting dark-field BSEs. Dark-field BSEs may include electrons with relatively large polar angles such as shown by a relatively large emanating angle ρ of electrons 108f. The emanating angle ρ may be measured between the path of the electrons 108f and normal to the top outer surface 428 of the sample 118.

In embodiments, a design scheme of a detector array 216 may be followed. For example, geometric parameters of dimensions of a detector array 216 may be constrained by the values of other geometric parameters. For instance, the design scheme may abide by the following:

$$\rho 1 < \rho < \rho 2 \quad \text{(Equation 1)}$$

$$\rho 1 = \arctan\left(\frac{d}{2h}\right) \quad \text{(Equation 2)}$$

$$\rho 2 = \arctan\left(\frac{p-g}{2h}\right) \quad \text{(Equation 3)}$$

where d is the pass-through channel size 406, h is the sample separation distance 408, g is the gap width 410, and p is the pitch 412 between the detectors 420. Further, ρ1 is an angle associated with electron paths that travel between the center of the measurement region and the outer edge of the active layer (e.g., layers 414, 416) of the detector 420, and ρ2 is an angle associated with electrons paths that travel between the center of the measurement region and the inner edge of the active layer of the detector 420. For example, ρ2 is the angle between electron path of electrons 108e and a line normal to outer upper surface of the sample 118. Using this design scheme, BSEs 108 with an emanating angle ρ between ρ1 and ρ2 may be detected. In examples, such a design scheme may be used in a system or method to balance various factors. For instance, such a design scheme may be used to balance (e.g., optimize) a desired range of emanation angles ρ to be detected against a maximum density of (e.g., minimum pitch between) detectors 420.

The distribution of BSEs 108 as a function of their emanation angle ρ may be approximated using the function of sin(2*ρ), where the peak intensity of the distribution is at an emanating angle ρ of 45°.

As an illustrative example, consider the design scheme above for detecting BSEs 108 between ρ1 of 34° and ρ2 of 72°. These ρ1 and ρ2 values allow for detecting most dark field BSEs while bright-field SEs with relatively smaller emanation angles (e.g., less than 20°) may desirably pass through the pass-through channel 218. In embodiments, such SEs pass through the detector 420, be image-formed by the objective lens 324, and be detected by the secondary detector 220. For such a design scheme, using the equations above, the pass-through channel size 406 (d) may be 20 μm, the pitch 412 (p) may be 100 μm, the sample separation distance 408 (h) may be 15 μm, and the gap width (g) may be 10 μm. Note that there is more than one solution that abides by the design scheme above and constraining one parameter constrains the other parameters, but does not necessarily create discrete, exact solutions.

In embodiments, the detector array 216 includes a substrate 418. For example, the substrate 418 may be a layer. For instance, the substrate 418 of each detector 420 may be coplanar.

In embodiments, the detector array 216 includes an active layer. For example, the active layer may include at least one of an n-type layer 414 or a p-type layer 416. For instance, each detector 420 may include the substrate 418 between and adjacent to the p-type layer 416 and the n-type layer 414. In this regard, the p-type and n-type layers may be deposited on a silicon substrate in a chip fabrication process to produce a detector array 216 that includes (or is) a chip. In examples, the p-type layer 416 and/or the n-type layer 414 include a height/thickness on the scale of microns (e.g., 10 μm or less).

In embodiments, the imaging sub-system 202 is configured to include a working distance pass-through channel between the electron optics 214 and the sample 118. For example, the working distance pass-through channel may be defined by a working distance 424 between a component (e.g., the lowest component) of the electron optics 214 and the sample 118. For instance, the component may be the charge control plate 106 and the working distance 424 may allow for enough space for moving the detector array 216 into the first position. In embodiments, the working distance 424 is on the scale of hundreds of microns to a few millimeters or more (e.g., 100 μm or more, 500 μm or more, 1 mm or more, 2 mm or more, 5 mm or more, or the like). Such a working distance 424 may be used to accommodate a z-direction thickness of a detector array 216 (e.g., detector array chip) on a rough scale of tens or hundreds of microns (e.g., 10 μm or less, 20 μm or less, 50 μm or less, 100 μm or less, 200 μm or less, 500 μm or less, 1 mm or less, 2 mm or less, or the like).

In embodiments, a gap width 410 of a gap material 426 located between detectors 420 is on the scale of microns (e.g., 10 μm or less). The gap material 426 may be configured to shield (e.g., electrically insulate) each detector 420 such as by including electrically insulative material known in the art.

In embodiments, the charge control plate pass-through channel size 422 is on the scale of hundreds of microns or more (e.g., at least 100 microns, at least 1 mm) and is configured to receive all beamlets 210.

Figure 5:
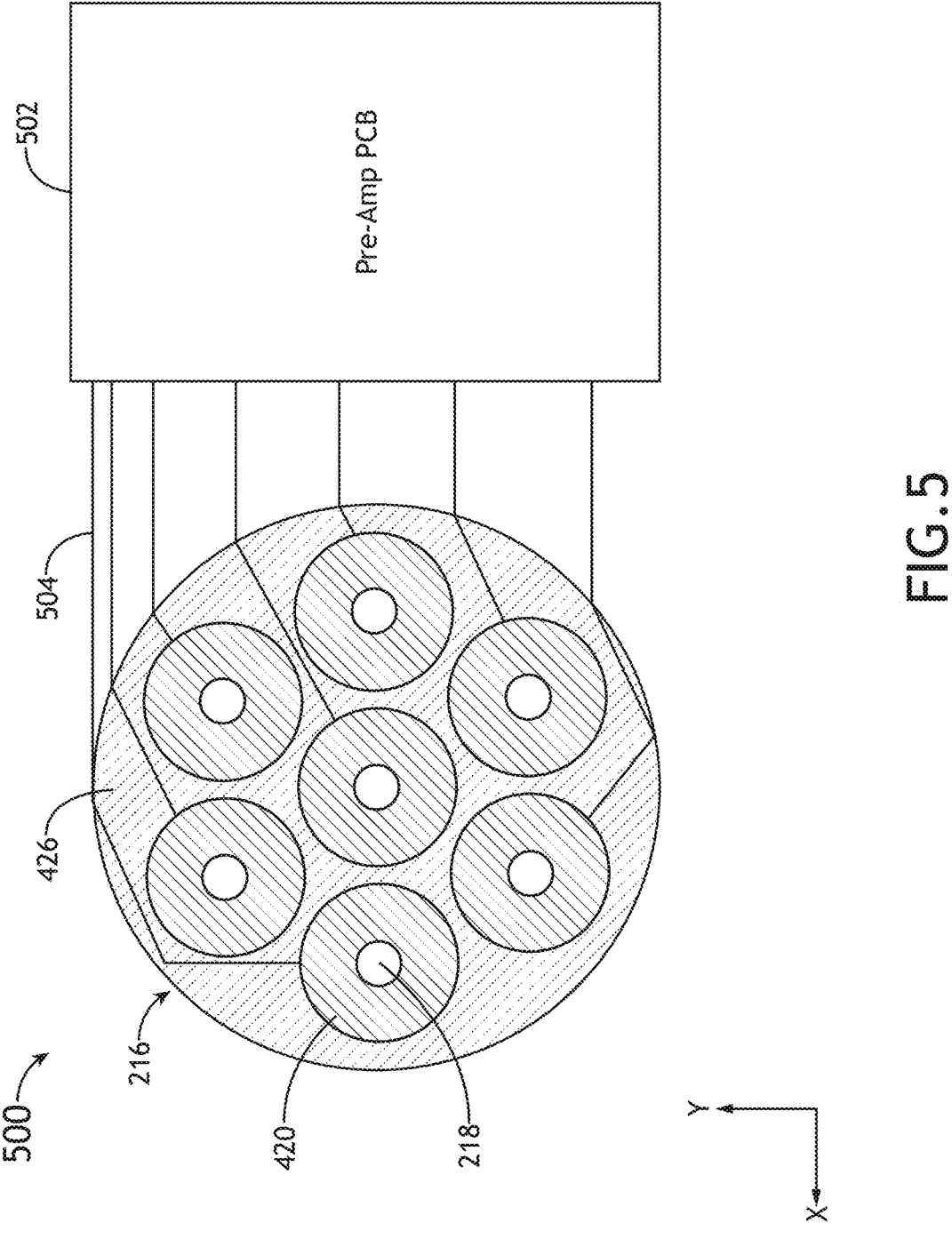
FIG. 5 is a simplified schematic top view of a detector array, in accordance with one or more embodiments of the present disclosure.

FIG. 5 illustrates a simplified schematic top view 500 of a detector array 216, in accordance with one or more embodiments of the present disclosure. Note that the number and arrangement of detectors 420 shown is nonlimiting and simplified for illustrative purposes.

In embodiments, the detector array 216 includes connecting elements 504 coupled (e.g., electrically connected) to the detectors 420. For example, the connecting elements 504 may include wires, embedded silicon chip conducting lines, through-vias, or the like for transmitting signals. For instance, the connecting elements 504 may be soldered wires or embedded in a substrate. In embodiments, the connecting elements 504 may be coupled (e.g., electrically connected) to other elements. For example, such other elements may include a pre-amp PCB 502.

In embodiments, each detector 420 includes elements that are circular and/or cylindrical. For example, the pass-through channels 218 and/or inner-facing detecting surfaces of the active layer may be circular.

Figure 6:
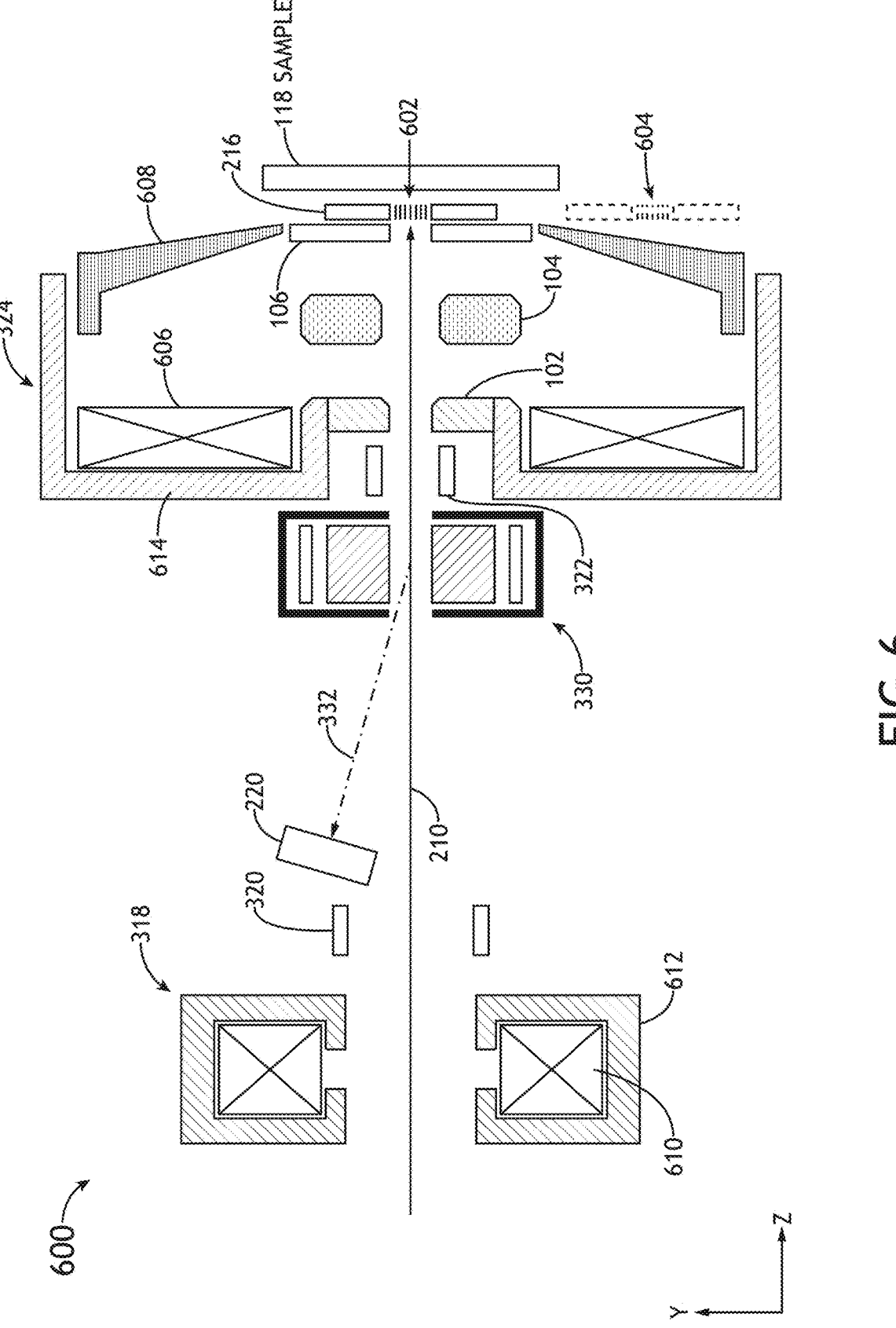
FIG. 6 is a simplified schematic view of an imaging sub-system, in accordance with one or more embodiments of the present disclosure.

FIG. 6 illustrates a simplified schematic view 600 of an imaging sub-system 202, in accordance with one or more embodiments of the present disclosure.

As noted previously herein, the detector array 216 may be configured to be actuatable between a first position 602 and a second position 604.

In embodiments, the Wien filter 330 includes an E×B energy filter consisting of an electrostatic deflector and a magnetic deflector with the electrostatic deflection field being perpendicular to the magnetic deflection field.

In embodiments, the objective lens 324 includes a magnetic lensing section and an electrostatic section. The magnetic lensing section may include an upper pole piece 614, a lower pole piece 608, and coils 606. The electrostatic section may include a ground electrode 102, a booster electrode 104, and a charge control plate 106. The booster electrode 104 may be configured to boost primary electrons of beamlets 210 when voltage is applied to reduce Coulomb interactions and improve resolution. In embodiments, a preferred location of common crossover volume 326 is around the booster electrode 104 to improve resolution. The charge control plate 106 may be used to charge the sample 118 for a specific extracting field, and thereby control the depth of the field of view to be imaged.

In embodiments, the upper scanner deflector 320 and the lower scanner deflector 322 may be preferred over electrostatic deflectors for high-speed, high-throughput scanning of field of views. In embodiments, scanning of field of views may be performed using the upper scanner deflector 320 and the lower scanner deflector 322. For example, beamlets 210 may continue to pass through a center (not labeled) of the objective lens 324 throughout the scanning process. For instance, the deflectors 320, 322 may be used in concert-one to deflect the beamlets 210 off-center and one to re-deflect the beamlets 210 back through the center. The amount of deflection of deflectors 320, 322 may be in proportion to each other such that the beamlets 210 are maintained through a constant center point along a center axis parallel to the z-direction. For example, such deflections may be orientated along angles non-parallel to the center axis, allowing for scanning along the x-direction and the y-direction of the sample 118. A change in the amount of deflection, and thereby a change in the angle through the center point, may allow for moving the field of views within scanning field of views (SFOVs). For an example of SFOVs, see SFOVs of FIG. 13. Passing the beamlets 210 through the center of the objective lens (OL) principal image plane (see, e.g., principal image plane 702 of FIG. 7) may reduce off-axis aberrations and distortion.

Figure 7:
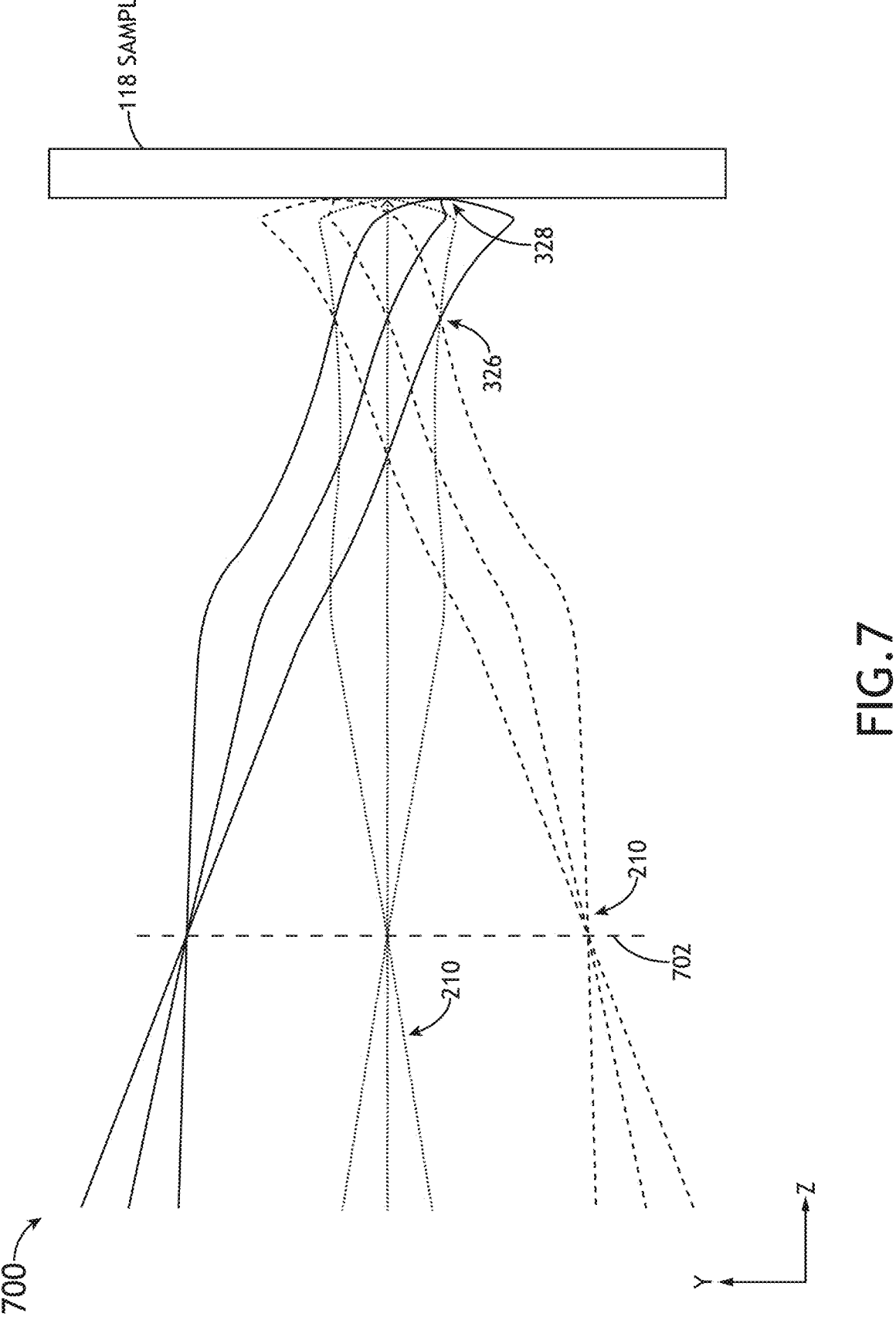
FIG. 7 is a simplified schematic view of secondary electron trajectories and image forming relations, in accordance with one or more embodiments of the present disclosure.

FIG. 7 illustrates a simplified schematic view of SE trajectories and image forming relations, in accordance with one or more embodiments of the present disclosure. For example, FIG. 7 may be produced by ray-tracing simulations with computer modeling of elements in accordance with one or more embodiments. The principal image plane 702 may be the image-forming plane of the objective lens 324. The principal image plane 702 may largely depend on the landing energies of the beamlets 210.

Figure 8:
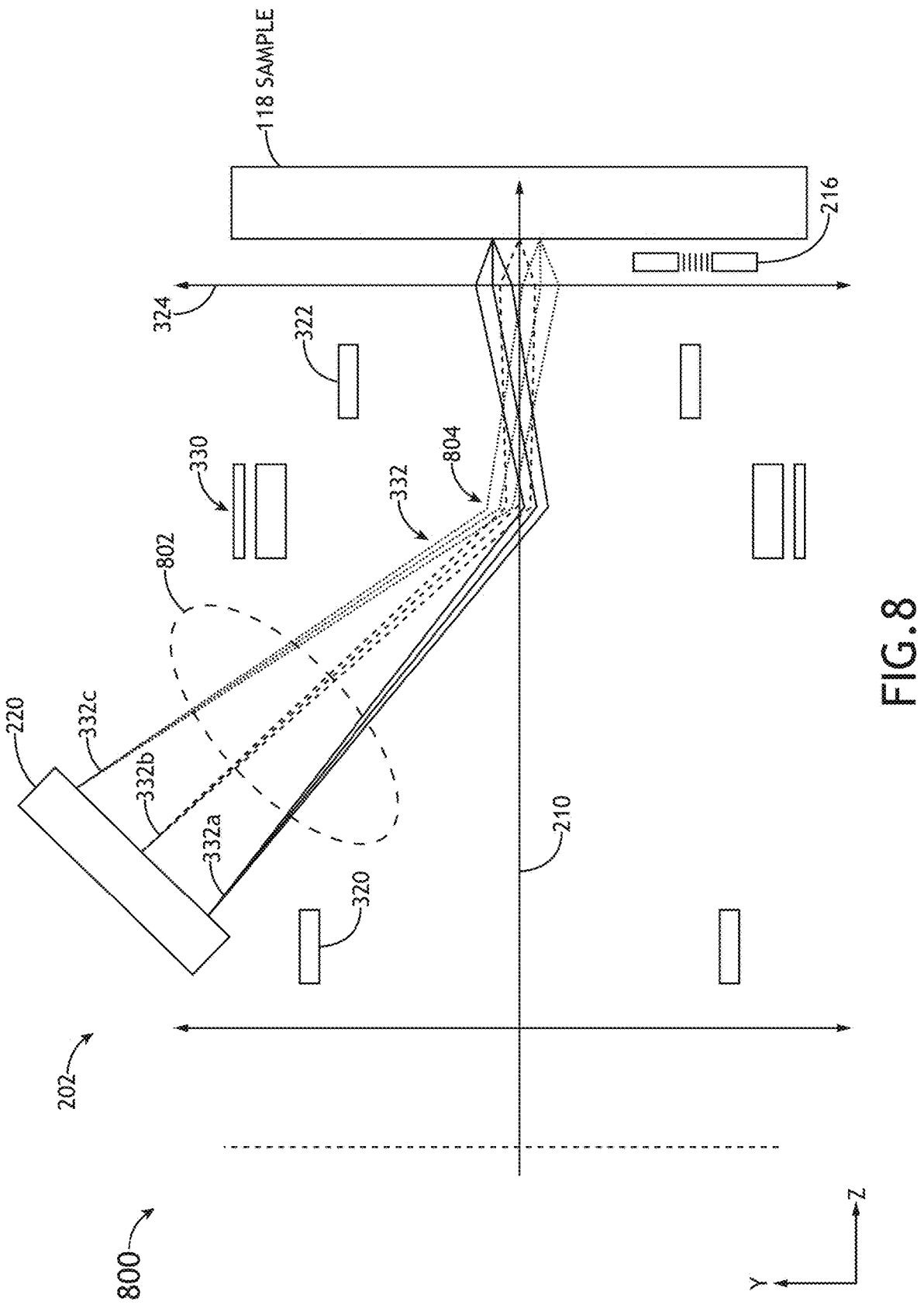
FIG. 8 is a simplified schematic view of an imaging sub-system, in accordance with one or more embodiments of the present disclosure.

FIG. 8 illustrates a simplified schematic view 800 of an imaging sub-system 202, in accordance with one or more embodiments of the present disclosure. FIG. 8 may be used to illustrate detection of SEs 332 when the detector array (not shown) is retracted.

SEs 332a, 332b, 332c may be associated with three beamlets 210. In embodiments, SEs 332a, 332b, 332c are simultaneously focused by the objective lens 324 and image-formed in an image plane with secondary crossover volume 804.

In embodiments, in an alternate imaging mode, the Wien filter 330 is used to deflect the SEs 332 (e.g., 332a, 332b, 332c) towards the secondary detector 220. In practice, the SEs 332 may be adjusted using secondary electron optics 802. The secondary electron optics 802 may include any optics such as modulators. The secondary electron optics 802 may modulate the SEs 332 to adjust the image plane onto the secondary detector 220 due to large variations caused by user-selected variations in landing energy of a particular measurement. The secondary electron optics may be used to adjust SEs 332 such as, but not limited to, rotating, magnifying, de-scanning (e.g., compensating for scanning), space-filtering, and/or energy-dispersion-correcting. The energy-dispersion-correcting may be performed to achieve higher SE collection efficiencies associated with the secondary detector 220 and reduced cross-talk. An example of the arrangement of SEs 332 as image-formed on the secondary detector 220 may be illustrated similar to the arrangement of beamlets 202 shown in FIG. 13.

In examples, the SEs 332 arrangement is five to twenty times magnified compared to the arrangement of beamlets 210 on the sample 118 to allow for larger, more cost-effective and/or easier-to-fabricate secondary electron optics 802.

Figure 9:
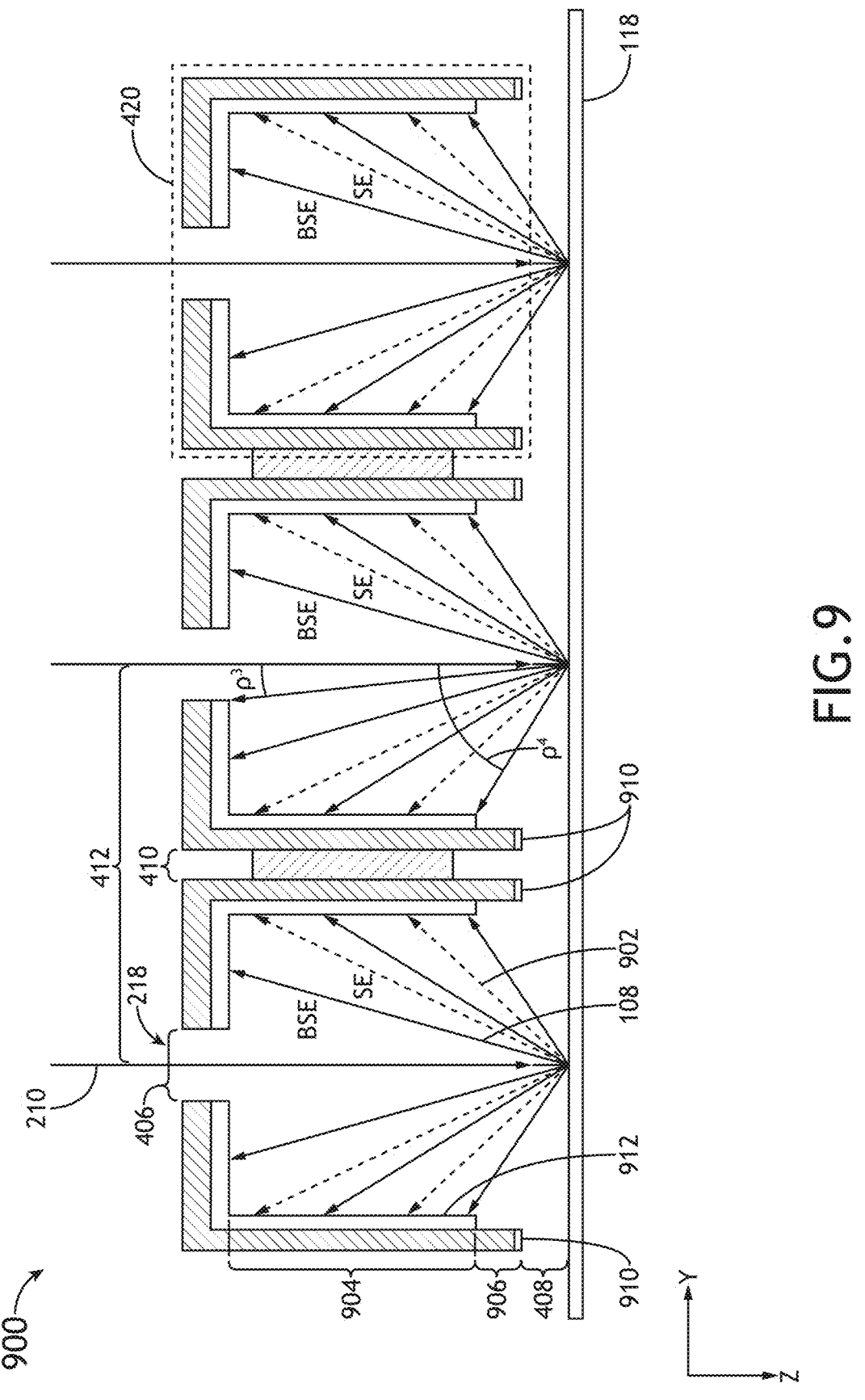
FIG. 9 is a simplified schematic view of a detector array with caps, in accordance with one or more embodiments of the present disclosure.

FIG. 9 illustrates a simplified schematic view 900 of a detector array 216 with caps, in accordance with one or more embodiments of the present disclosure.

In embodiments, each detector 420 includes a recess. For example, such a recess may include surfaces facing (including orthogonal to) a sample 118 such that electrons 108 emanating from the sample may be directed at such surfaces. In embodiments, each detector 420 may increase a surface area of detecting surfaces by using detecting surfaces that extend along a direction of propagation of a beamlet 210. For example, rather than a detecting surface that does not generally extend along a direction of propagation (e.g., Z direction) as shown by coplanar detecting surfaces of FIG. 12, each detector 420 may include at least some non-coplanar surfaces. For example, an inner surface of a cylinder of a first detector may be non-coplanar relative to the inner surface of a second cylinder of a second detector. In some examples, the inner surface of a cylinder and an inner surface of a cap (even if coplanar to other caps) may define a recess as shown in FIG. 9. Note that such an example is merely for illustrative purposes and detecting surfaces that extend along a direction of propagation defining a recess may be any shape/profile (e.g., inside of a cone and/or curved surfaces such as inside of a half sphere, inside of a half ellipsoid, any other concave surface, and the like). Compared to planar surfaces normal to the direction of propagation, surfaces that extend along the direction of propagation have larger surface areas. In embodiments, a larger surface area may allow for better image metrics, such as clarity and resolution.

In embodiments, the sample separation distance 408 is changed by actuation of the sample stage and/or actuation of the detector array 216 using actuators (not shown). In an optional step, controller 204 may direct such an actuation to be performed based on a distance sensor (e.g., any distance sensor such as laser optical distance sensors) configured to sense the sample separation distance 408. For example, the detector array 216 may include one or more capacitive sensor heads 910 configured to at least one of sense or control a position of the detector array 216 relative to the sample 118. For example, capacitive sensor heads 910 may be configured to sense a change in capacitance that varies as a function of the sample separation distance 408 relative to the sample 118. The controller 204 may be configured to calculate the sample separation distance 408 based on such a function and the sensed capacitance. Further, based on the sample separation distance 408, and a desired distance, the controller may be configured to direct an actuator to change the sample separation distance 408 of the detector array 216 by actuating the detector array 216 along the direction of propagation (e.g., Z direction) by the difference between the sample separation distance 408 and the desired distance. In this regard, the capacitive sensor heads 910 may be used to control the sample separation distance 408 to the sample 118. Actuation may be performed using any actuator (not shown) known in the art such as, but not limited to, piezoelectric actuators, electric motor-based screw drives, pneumatic actuators, and the like. For example, three or four actuators symmetrically positioned around the detector array 216 may be used to tilt and translate the detector array 216 using two or more degrees of freedom.

As noted previously, each detector array 216 may include an active layer 912 configured for detecting electrons 108.

In embodiments, the active layer 912 includes a cylindrical shape configured to be aligned with a beamlet when in a detecting position. For example, as shown, a cylindrical inner facing surface of the active layer 912 may be aligned with beamlet 210. Further, the active layer 912 may include a cap. For example, the cap may include an inner facing cap surface facing the sample 118 at an upper end of the cylindrical shape and adjacent to the cylindrical shape. For instance, the cap may include and/or define the pass-through channel 218.

In embodiments, the active layer 912 includes a PN detecting configuration or a PIN detecting configuration. For example, the active layer 912 may include p-type silicon and n-type silicon deposited on a silicon substrate. For example, the active layer 912 may include PIN layers including a p-type layer and an n-type layer on each side of an undoped intrinsic semiconductor layer.

In embodiments, an inner-facing surface of the active layer 912 is coated with an aluminum coating layer (not labeled). For example, the aluminum coating layer may be around 10 nanometers thick (e.g., less than 50 nanometers but more than 1 nanometer). The aluminum coating layer may block SEs having low energies and BSEs with high energies may penetrate through the aluminum coating layer and bombard the active layer 912 such as PN or PIN layers.

In embodiments, a recessed design scheme for recessed detectors may be followed. For instance, the recessed design scheme may abide by the following:

$$\rho3 < \rho < \rho4 \qquad \text{(Equation 4)}$$

$$\rho3 = \arctan\left(\frac{d}{2(h1 + h2 + h3)}\right) \qquad \text{(Equation 5)}$$

$$\rho4 = \arctan\left(\frac{p - g}{2(h2 + h3)}\right) \qquad \text{(Equation 6)}$$

where h3 is the sample separation distance 408, h2 is an additional distance to active layer 906, and h1 is a recess depth 904. In embodiments, each detector may include an extended portion of an element (e.g., substrate) as defined by the additional distance to active layer 906. The extended portion may be an inactive/non-detecting region configured to block low electrons with paths greater than emanation angle ρ4. Such blocking using the extended portion may significantly reduce crosstalk between BSEs of different beamlets 210.

As an illustrative example, consider the recessed design scheme above for detecting electrons 108 between ρ3 of 5° and ρ4 of 66°. For such a recessed design scheme, using the equations above, the pass-through channel size 406 (d) may be 20 μm, the pitch 412 (p) may be 100 μm, the gap width (g) may be 10 μm, the sample separation distance 408 (h3) may be 10 μm, the additional distance to active layer 906 (h2) may be 10 μm, and the recess depth 904 (h1) may be 100 μm.

Figure 10:
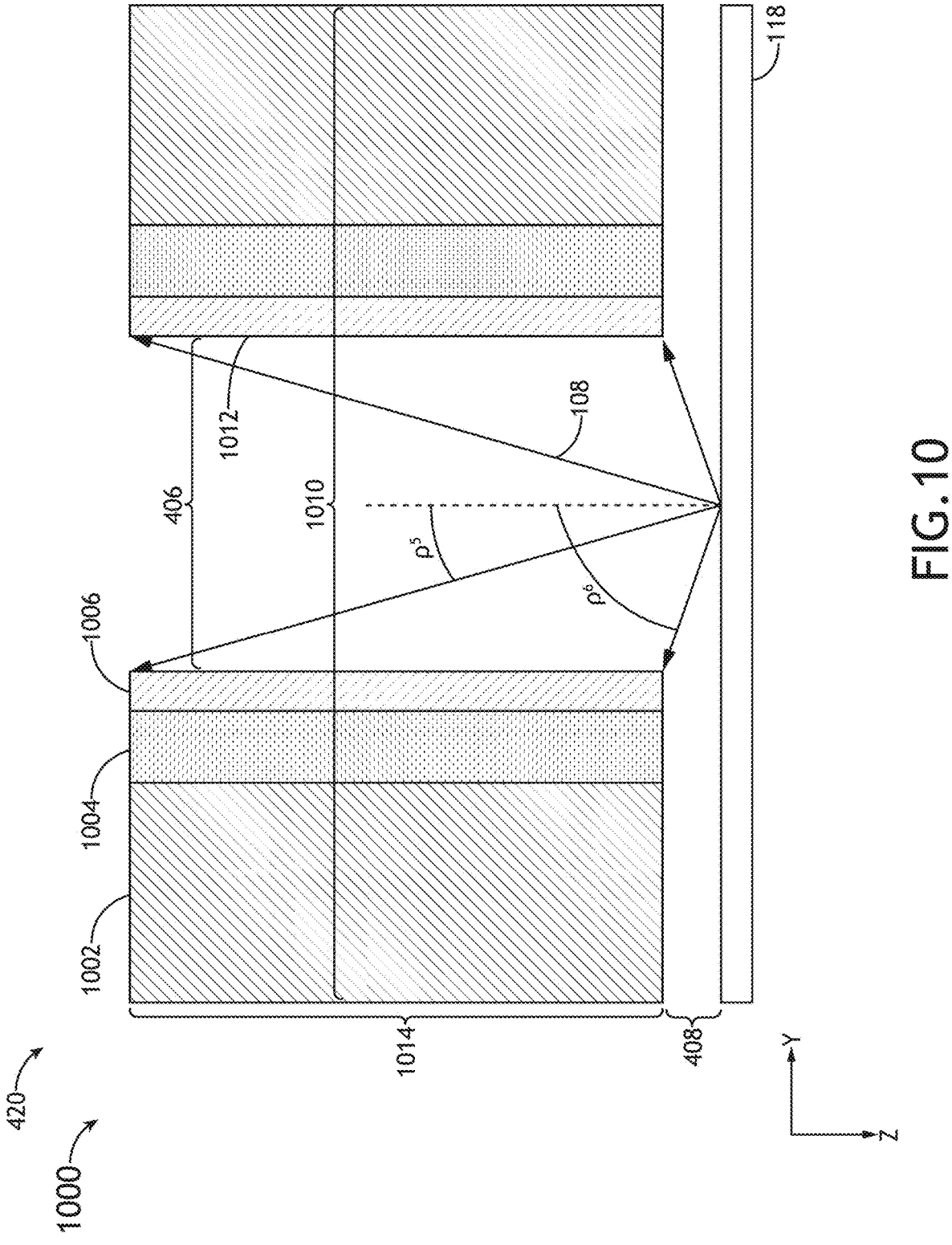
FIG. 10 is a simplified schematic view of a detector without a cap, in accordance with one or more embodiments of the present disclosure.

FIG. 10 illustrates a simplified schematic view 1000 of a detector 420 without a cap, in accordance with one or more embodiments of the present disclosure. Compared to the detector 420 of FIG. 9, the detector 420 in FIG. 10 may be in a cylindrical configuration and may, but is not required to, include a relatively thicker substrate layer and be deeper in the Z-direction.

In embodiments, a cylindrical design scheme for cylindrical detectors is followed. For instance, the cylindrical design scheme may abide by the following:

$$\rho5 < \rho < \rho6 \qquad \text{(Equation 7)}$$

$$\rho5 = \arctan\left(\frac{d}{2(h4 + h3)}\right) \qquad \text{(Equation 8)}$$

$$\rho6 = \arctan\left(\frac{D}{2(h3)}\right) \qquad \text{(Equation 9)}$$

where h3 is the sample separation distance 408, h4 is an active layer depth 1014, and D is a detector width 1010 equivalent to the pitch 412 minus the gap width 410 of FIG. 4.

As an illustrative example, consider the cylindrical design scheme above for detecting electrons 108 between ρ5 of 4° and ρ6 of 74°. For such a cylindrical design scheme, the pass-through channel size 406 (d) may be 70 μm, the sample separation distance 408 (h3) may be 10 μm, and the active layer depth 1014 (h4) may be 500 μm.

In embodiments, each detector 420 includes an aluminum coating layer 1012. For example, an aluminum coating layer 1012 may be disposed on an inner surface as shown. For instance, the aluminum coating layer 1012 may aid in filtering out SEs, but allow detection of BSEs.

Figure 11:
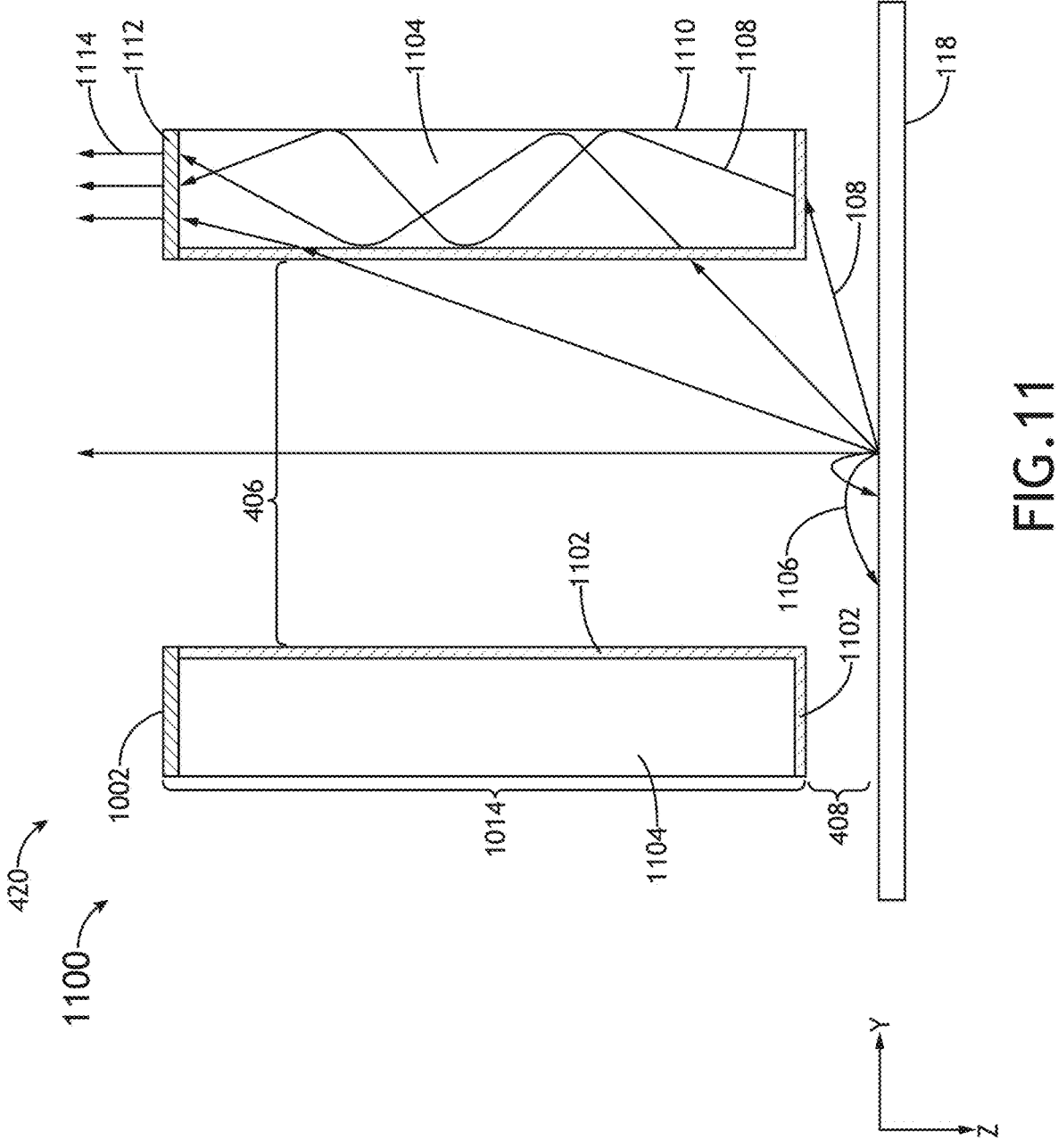
FIG. 11 is a simplified schematic view of a detector with a scintillator layer, in accordance with one or more embodiments of the present disclosure.

FIG. 11 illustrates a simplified schematic view 1100 of a (scintillator) detector 420 with a scintillation layer 1102, in accordance with one or more embodiments of the present disclosure. The (scintillator) detector 420 may be configured for a scintillator-to-photoemission style of electron 108 detection. Compared to the (cylindrical) detector 420 in FIG. 10, for identical values of active layer depth 1014 and sample separation distance 408, the (scintillator) detector 420 may include the following advantages: conversion of large energy band BSEs to SEs may be performed with little to no energy loss; conversion of wide range of emanation angles of BSEs to near normal angles of SEs may be performed; detection electronics of secondary detector 220 may be used which may negate the need for detection electronics of the detector array 216; and SEs 1106 may be filtered out with a negatively charged surface 1110 (e.g., which may include another scintillator layer).

In embodiments, each detector 420 includes a scintillation layer 1102. The scintillation layer 1102 may be coated on an inner facing surface (e.g., inner cylindrical surface region as shown) and/or a sample-facing surface (e.g., distal end region as shown). The scintillation layer 1102 may be configured to generate photons based on received electrons 108.

In embodiments, each detector 420 includes an aluminum coating layer 1110. For example, an aluminum coating layer 1110 may be disposed on an outer surface as shown. For instance, the aluminum coating layer 1110 may be biased with a voltage (e.g., −100V), such that the SEs 1106 emitted from the sample 118 may be rejected/repelled because of their low energies. In this regard, the aluminum coating layer 1110 may aid in filtering out SEs 1106, but allow detection of other electrons 108 such as BSEs.

In embodiments, each detector 420 includes a photocathode element 1112. For example, a photocathode element 1112 may include a photocathode material and be disposed on a top surface as shown.

The photons 1108 may be internally reflected by at least one of the aluminum coating layer 1110 or the scintillation layer 1102. Further, the photons 1108 may ultimately be directed to bombard the photocathode element 1112. The photocathode element 1112 may be configured to generate new electrons 1114 based on the photons 1108. The new electrons 1114 may have low initial energies. For example, the low initial energies may be roughly similar to the energies of the SEs 1106.

In embodiments, the new electrons 1114 are directed to the secondary detector 220 and detected by the secondary detector 220.

Figure 12:
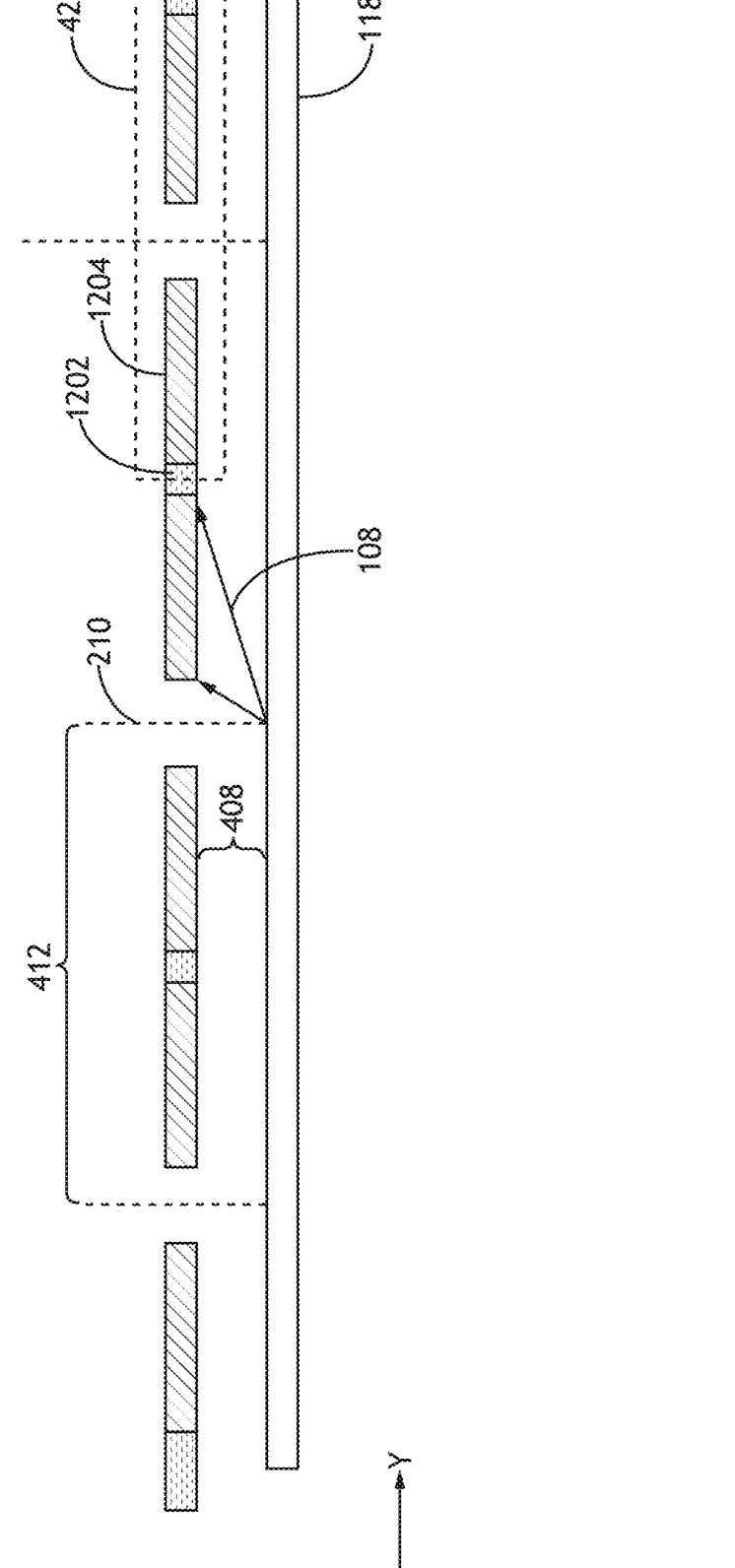
FIG. 12 is a simplified schematic view of a detector array with coplanar detectors, in accordance with one or more embodiments of the present disclosure.

FIG. 12 illustrates a schematic view 1200 of a detector array 216 with coplanar detectors 420, in accordance with one or more embodiments of the present disclosure. In embodiments, the detectors 420 may be coplanar. Further, for example, substrates 1204 and active layers facing the sample 118 may be coplanar.

Figure 13:
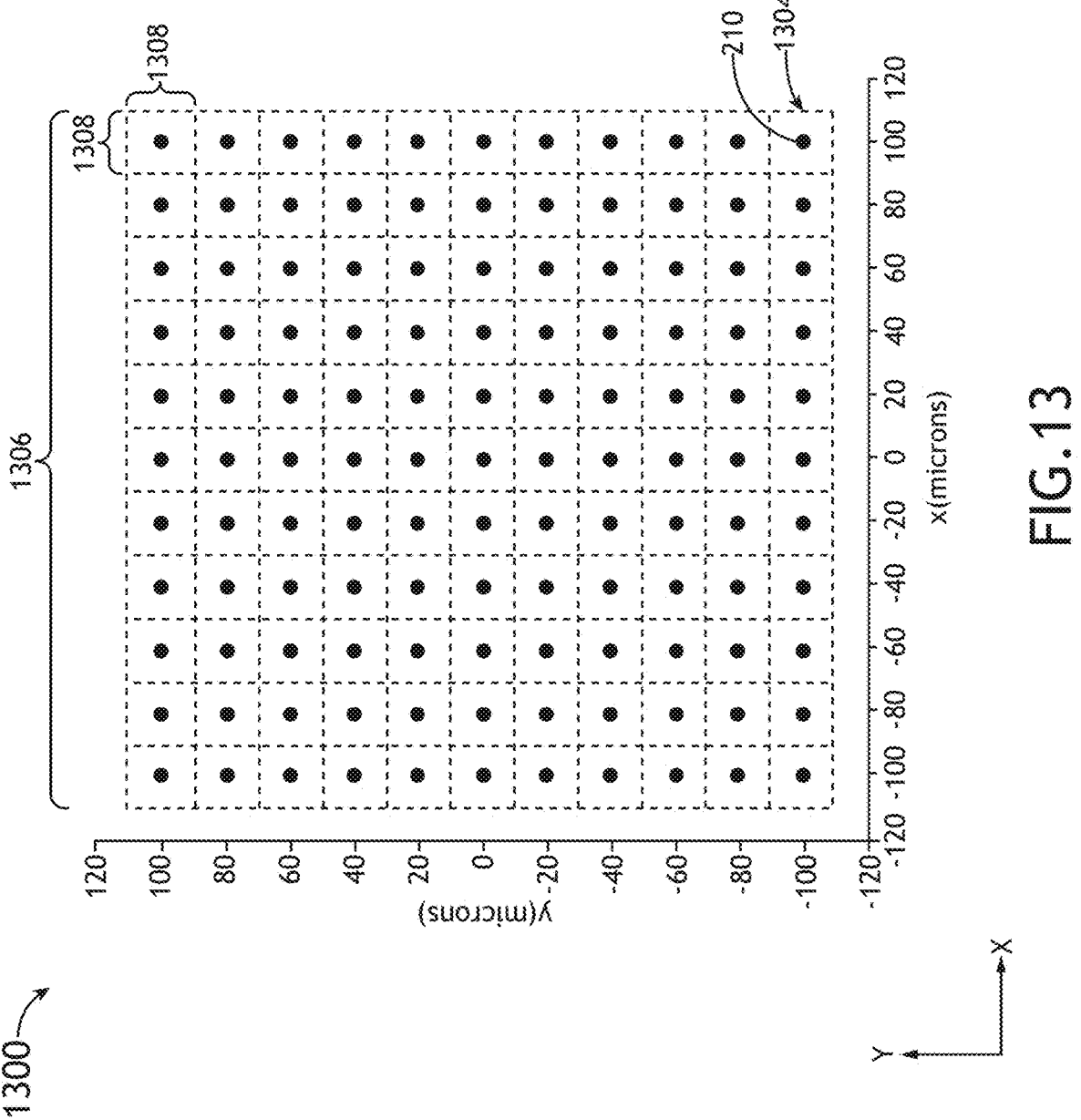
FIG. 13 is a schematic view of a field of view array corresponding to a plurality of beamlets, in accordance with one or more embodiments of the present disclosure.

FIG. 13 illustrates a schematic view 1300 of a field of view array corresponding to a plurality of beamlets 210, in accordance with one or more embodiments of the present disclosure.

The field of view array represents an imagable area of the imaging sub-system 202. For example, a width 1306 and height of the field of view array may be 220 μm by 220 μm.

In embodiments, the field of view array includes scanning field of views (SFOVs) with dimensions 1308 (e.g., 20 μm by 20 μm), each associated with a beamlet 210. In embodiments, the number of SFOVs may be a 11 by 11 grid of 121 SFOVs. A pitch between SFOVs may be 20 μm. In embodiments, each beamlet 210 is simultaneously scanned (e.g., raster scanned) over its respective SFOV. For example, such scanning may be performed by a global component of the electron optics 214 configured to adjust all beamlets simultaneously. For instance, such a global component may include the lower scanner deflector 322.

In embodiments, a step-and-scan method is used for scanning large areas of a sample 118. For example, the field of view array may be scanned as described above at a first location. Further, the field of view array may be scanned at a second location (e.g., adjacent the first location). For instance, the field of view array may be tiled across the sample 118 for scanning large areas. Moving of the field of view array may be performed by the sample stage 222 and/or via deflection of the beamlets via electron optics 214.

Figure 14:
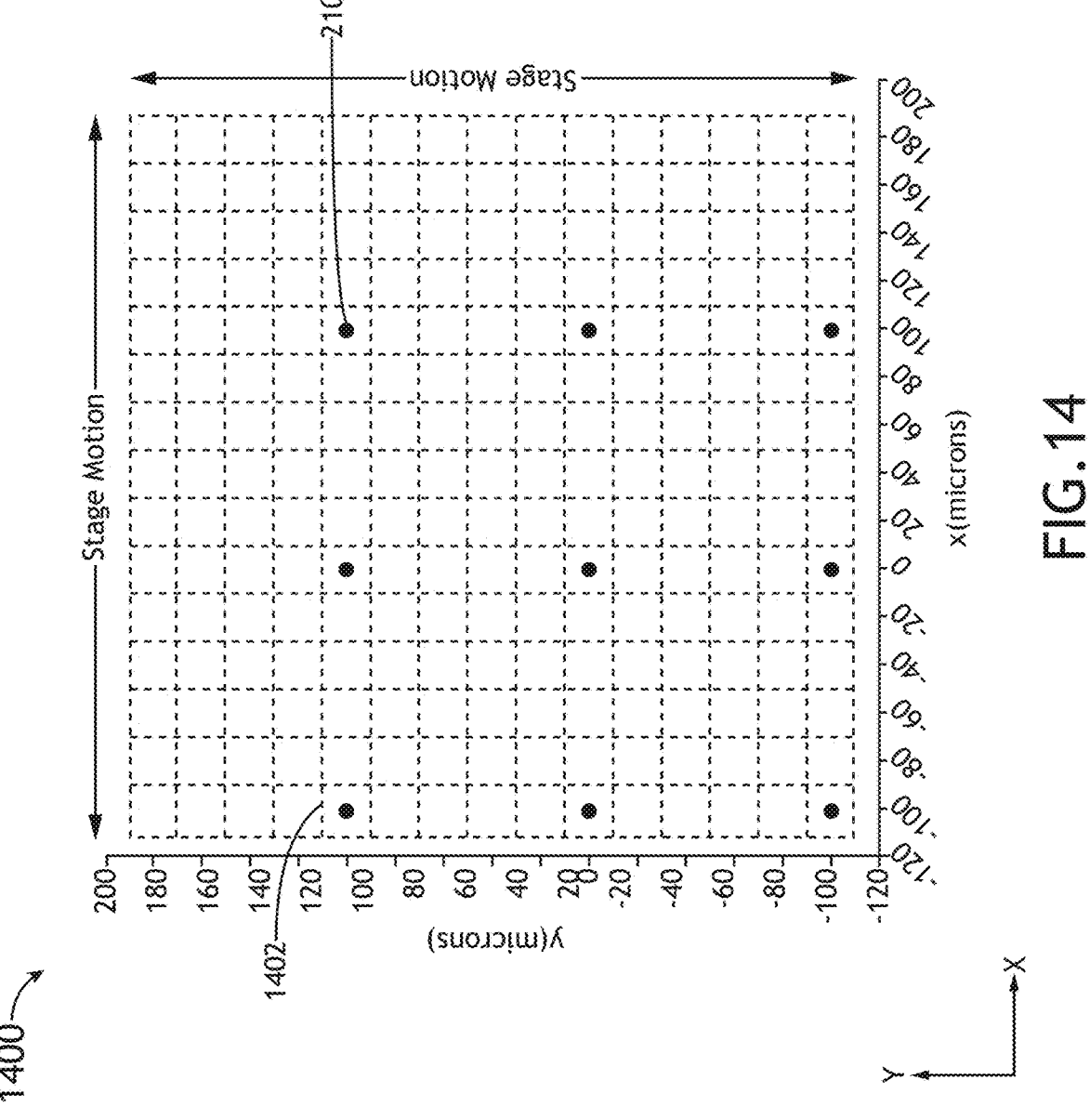
FIG. 14 is a schematic view of nine field of views, in accordance with one or more embodiments of the present disclosure.

FIG. 14 illustrates a schematic view 1400 of nine field of views 1402, in accordance with one or more embodiments of the present disclosure.

In embodiments, the pitch 412 between beamlets 210 is, in a sense, dynamically adjusted by selectively controlling the beamlets 210. For example, a subset of the beamlets 210 having a larger pitch between adjacent beamlets 210 may be selected. For instance, the other beamlets 210 may be blanked off (e.g., deflected away such that the beamlet 210 does not reach the sample 118) so that the remaining beamlets 210 in the subset are spaced farther apart. For example, the micro deflector array 312 may be used to blank off beamlets 210. An advantage of increasing the pitch 412 between beamlets 210 is reduced crosstalk.

For example, the subset may include beamlets 210 where at most every second beamlet 210 is used. For instance, every fifth beamlet 210 may be used as shown in FIG. 14 in a three-by-three beamlet arrangement to achieve at least a 100 μm pitch. In this regard, the pitch 412 may be increased by five times.

For a subset of beamlets 210, a method of scanning may be performed. For example, the method may utilize the detector array 216 in the first position for detecting BSEs. In a first step, the subset may be scanned within their respective SFOVs. For example, the nine beamlets 210 in FIG. 14 may be scanned. In a second step, the sample 118 may be moved (e.g., moved via the sample stage 222) such that the beamlets 210 are in a different SVOF. For example, each of the nine beamlets 210 may be moved to an adjacent SVOF, such as the SVOF to the immediate right. In a third step, the remaining SVOFs may similarly be imaged. For example, all twenty-five SVOFs associated with each beamlet 210 may be scanned in a five-by-five pattern. In this regard, the entire 300 μm by 300 μm field of view array may be imaged over time. In a fourth step, the field of view array may be moved a different location such as adjacent to the previous field of view array location. In this regard, a tiling of imaging a larger area of the sample 118 may be performed.

Referring again to FIGS. 2-14, embodiments and various components are described in additional detail.

In embodiments, the sample stage 222 may include any sample stage known in the art of electron-beam microscopy. In embodiments, the sample stage 222 is an actuatable stage. For example, the sample stage 222 may include, but is not limited to, one or more translational stages suitable for selectably translating the sample 118 along one or more linear directions (e.g., x-direction, y-direction and/or z-direction). By way of another example, the sample stage 222 may include, but is not limited to, one or more rotational stages suitable for selectively rotating the sample 118 along a rotational direction. By way of another example, the sample stage 222 may include, but is not limited to, a rotational stage and a translational stage suitable for selectably translating the sample along a linear direction and/or rotating the sample 118 along a rotational direction.

The sample 118 may include any sample suitable for characterization (e.g., inspection or review) with electron-beam microscopy. In embodiments, the sample 118 includes a wafer, die, chip, or the like. For example, the sample may include, but is not limited to, a semiconductor wafer. As used through the present disclosure, the term "wafer" refers to a substrate formed of a semiconductor and/or a non-semiconductor material. For instance, in the case of a semiconductor material, the wafer may be formed from, but is not limited to, monocrystalline silicon, gallium arsenide, and/or indium phosphide. In another embodiment, the sample includes a photomask/reticle. In embodiments, the sample 118 includes a mask such as a reticle mask, lithography mask, and the like.

The detector array 216 and/or secondary detector 220 may include any type of electron detector assembly known in the art configured to detect electrons (e.g., secondary and/or backscattered electrons). For example, detector array 216 may collect and image the SEs using an Everhart-Thornley detector (or other type of scintillator-based detector). In another embodiment, SEs may be collected and imaged using a micro-channel plate (MCP). In another embodiment, electrons may be collected and imaged using a PIN or p-n junction detector, such as a diode or a diode array. In another embodiment, electrons may be collected and imaged using one or more avalanche photo diodes (APDs).

As noted previously herein, the one or more processors 206 of the controller 204 may be communicatively coupled to memory 208, where the one or more processors 206 may be configured to execute a set of program instructions maintained in memory 208, and the set of program instructions may be configured to cause the one or more processors 206 to carry out various functions and steps of the present disclosure.

It is noted herein that the one or more components of electron multi-beam imaging system 200 may be communicatively coupled to the various other components of electron multi-beam imaging system 200 in any manner known in the art. For example, the one or more processors 206 may be communicatively coupled to each other and other components via a wireline (e.g., copper wire, fiber optic cable, and the like) or wireless connection (e.g., RF coupling, IR coupling, WiMax, Bluetooth, 3G, 4G, 4G LTE, 5G, and the like). By way of another example, the controller 204 may be communicatively coupled to one or more components of electron multi-beam imaging system 200 via any wireline or wireless connection known in the art.

In embodiments, the one or more processors 206 include any one or more processing elements known in the art. In this sense, the one or more processors 206 may include any microprocessor-type device configured to execute software algorithms and/or instructions. In embodiments, the one or more processors 206 may consist of a desktop computer, mainframe computer system, workstation, image computer, parallel processor, or other computer system (e.g., networked computer) configured to execute a program configured to operate the electron multi-beam imaging system 200, as described throughout the present disclosure. It should be recognized that the steps described throughout the present disclosure may be carried out by a single computer system or, alternatively, multiple computer systems. Furthermore, it should be recognized that the steps described throughout the present disclosure may be carried out on any one or more of the one or more processors 206. In general, the term "processor" may be broadly defined to encompass any device having one or more processing elements, which execute program instructions from memory 208. Moreover, different subsystems of the electron multi-beam imaging system 200 (e.g., imaging sub-system 202, controller 204, user interface, and the like) may include processor or logic elements suitable for carrying out at least a portion of the steps described throughout the present disclosure. Therefore, the above description should not be interpreted as a limitation on the present disclosure but merely an illustration.

The memory 208 may include any storage medium known in the art suitable for storing program instructions executable by the associated one or more processors 206 and the data received from the electron multi-beam imaging system 200. For example, the memory 208 may include a non-transitory memory medium. For instance, the memory 208 may include, but is not limited to, a read-only memory (ROM), a random-access memory (RAM), a magnetic or optical memory (e.g., disk), a magnetic tape, a solid-state drive and the like. It is further noted that the memory 208 may be housed in a common controller housing with the one or more processors 206. In an alternative embodiment, the memory 208 may be located remotely with respect to the physical location of the processors 206, controller 204, and the like. In another embodiment, the memory 208 maintains program instructions for causing the one or more processors 206 to carry out the various steps described through the present disclosure.

In embodiments, the user interface is communicatively coupled to the controller 204. The user interface may include, but is not limited to, one or more desktops, tablets, smartphones, smart watches, or the like. In another embodiment, the user interface includes a display used to display data of the electron multi-beam imaging system 200 to a user. The display of the user interface may include any display known in the art. For example, the display may include, but is not limited to, a liquid crystal display (LCD), an organic light-emitting diode (OLED) based display, or a CRT display. Those skilled in the art should recognize that any display device capable of integration with a user interface is suitable for implementation in the present disclosure. In another embodiment, a user may input selections and/or instructions responsive to data displayed to the user via a user input device of the user interface.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

One skilled in the art will recognize that the herein described components operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

As used herein, directional terms such as "top," "bottom," "over," "under," "upper," "upward," "lower," "down," "downward", "X direction" and the like are intended to provide relative positions for purposes of description, and are not intended to designate an absolute frame of reference. Various modifications to the described embodiments will be apparent to those with skill in the art, and the general principles defined herein may be applied to other embodiments.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

Finally, as used herein any reference to "in embodiments, "one embodiment", "some embodiments", or the like means that a particular element, feature, structure, or characteristic described in connection with the embodiment is included in at least one embodiment disclosed herein. The appearances of the phrase "in embodiments" in various places in the specification are not necessarily all referring to the same embodiment, and embodiments may include one or more of the features expressly described or inherently present herein, or any combination of sub-combination of two or more such features, along with any other features which may not necessarily be expressly described or inherently present in the instant disclosure.

What is claimed:

1. An electron multi-beam imaging system comprising:
an imaging sub-system comprising:
one or more electron beam sources configured to generate a plurality of beamlets to simultaneously probe a plurality of measurement regions on a sample;

one or more electron optics configured to adjust the plurality of beamlets; and
a detector array, wherein the detector array comprises a plurality of detectors, wherein each detector of the detector array includes a pass-through channel, wherein a respective pass-through channel is configured to receive a respective beamlet of the plurality of beamlets to the sample wherein each detector is configured to detect electrons emanating from a measurement region of the sample, wherein the detector array is actuatable between a first position and a second position, wherein the first position comprises a detecting position configured for detecting backscattered electrons emanating from the sample, wherein the second position comprises a retracted position.

2. The electron multi-beam imaging system of claim 1, wherein the electrons comprise backscattered electrons.

3. The electron multi-beam imaging system of claim 1, wherein the detector array is configured to be disposed between the one or more electron optics and the sample.

4. The electron multi-beam imaging system of claim 1, wherein the imaging sub-system is configured to detect secondary electrons using a secondary detector when the detector array is in the retracted position.

5. The electron multi-beam imaging system of claim 1, wherein the plurality of detectors are coplanar.

6. The electron multi-beam imaging system of claim 1, wherein each detector comprises a recess facing the sample.

7. The electron multi-beam imaging system of claim 1, wherein each detector comprises an active layer.

8. The electron multi-beam imaging system of claim 7, wherein the active layer comprises at least one of an n-type or a p-type material.

9. The electron multi-beam imaging system of claim 8, wherein the active layer comprises an aluminum coating layer.

10. The electron multi-beam imaging system of claim 7, wherein the active layer comprises a substrate layer, a p-type layer, and an n-type layer.

11. The electron multi-beam imaging system of claim 7, wherein the active layer comprises a cylindrical shape configured to be aligned with the beamlet when in a detecting position.

12. The electron multi-beam imaging system of claim 11, wherein the cylindrical shape is adjacent a cap on an end of the cylindrical shape, wherein the cap comprises the pass-through channel.

13. The electron multi-beam imaging system of claim 11, wherein the cylindrical shape comprises a scintillator layer.

14. The electron multi-beam imaging system of claim 13, wherein the scintillator layer comprises a distal end region and an inner cylindrical surface region.

15. The electron multi-beam imaging system of claim 13, wherein the detector further comprises a photocathode element.

16. The electron multi-beam imaging system of claim 1, wherein the detector comprises a capacitive sensor head configured to at least one of sense or control a position of the detector array relative to the sample.

17. The electron multi-beam imaging system of claim 1, further comprising: a controller configured to select a subset of the plurality of beamlets, the subset having a larger pitch than the plurality of beamlets.

18. A method comprising:
generating electrons of a plurality of beamlets using one or more electron beam sources;

adjusting the plurality of beamlets using one or more electron optics configured to receive the plurality of beamlets;

receiving each beamlet of the plurality of beamlets through a pass-through channel of a respective detector of a detector array;

illuminating, for each beamlet, a measurement region of a sample;

collecting, for each beamlet, electrons emanating from the measurement region using the respective detector; and detecting the electrons using the respective detector;

actuating the detector array from a second position to a first position, wherein the first position comprises a detecting position configured for detecting the electrons emanating from the sample, wherein the second position comprises a retracted position.

19. The method of claim 18, wherein the electrons comprise backscattered electrons.

20. The method of claim 18, wherein the detector array is disposed between the one or more electron optics and the sample during the detecting of the electrons using the respective detector.

21. The method of claim 18, further comprising:

detecting secondary electrons using a secondary detector when the detector array is in the retracted position.

22. The method of claim 18, further comprising:

selecting a subset of the plurality of beamlets, the subset having a larger pitch than the plurality of beamlets.

* * * * *